(12) United States Patent
Sinyansky

(10) Patent No.: US 6,420,778 B1
(45) Date of Patent: Jul. 16, 2002

(54) DIFFERENTIAL ELECTRICAL TRANSMISSION LINE STRUCTURES EMPLOYING CROSSTALK COMPENSATION AND RELATED METHODS

(75) Inventor: Victor Sinyansky, Bridgewater, NJ (US)

(73) Assignee: Aralight, Inc., Jamesburg, NJ (US)

( * ) Notice: Subject to any disclaimer, the term of this patent is extended or adjusted under 35 U.S.C. 154(b) by 0 days.

(21) Appl. No.: 09/872,569

(22) Filed: Jun. 1, 2001

(51) Int. Cl.[7] .................. H01L 29/40; H01L 21/4763
(52) U.S. Cl. .................. 257/664; 257/758; 438/622
(58) Field of Search .................. 257/758, 662, 257/664; 438/622

(56) References Cited

U.S. PATENT DOCUMENTS

| | | | | |
|---|---|---|---|---|
| 5,003,273 A | * | 3/1991 | Oppenberg | 331/1 |
| 5,986,893 A | * | 11/1999 | Leigh | 361/777 |
| 6,162,992 A | * | 12/2000 | Clark et al. | 174/113 R |

FOREIGN PATENT DOCUMENTS

| | | | | |
|---|---|---|---|---|
| EP | 0 614 221 A1 | * | 9/1994 | H01L/23/64 |
| JP | 11-68414 | * | 3/1999 | H01P/3/08 |

* cited by examiner

Primary Examiner—T. N. Quach
(74) Attorney, Agent, or Firm—DeMont & Breyer, LLC

(57) ABSTRACT

A multilayer circuit structure characterized by reduced crosstalk includes first and second superposed planar dielectric layers. On the first layer, first and second conductor lines are formed, and on the second layer, third and fourth conductor lines are formed. The first and third conductor lines, and the second and fourth conductor lines, respectively, form at least a portion of corresponding first and second differential transmission line. The first conductor line extends in parallel with the third conductor line but is both vertically spaced and horizontally offset therefrom such that a first plane orthogonal to and extending through the first and second planar layers extends through one, but not both of the first and third conductor lines (i.e., a non-overlapping region). Similarly, a second plane orthogonal to and extending through the first and second planar layers extends through a non-overlapping region of the second and fourth conductor lines.

15 Claims, 6 Drawing Sheets

DIFFERENTIAL ELECTRICAL TRANSMISSION LINE STRUCTURES EMPLOYING CROSSTALK COMPENSATION AND RELATED METHODS

BACKGROUND OF THE INVENTION

1. Field of the Invention

The present invention relates to the transmission of electrical signals and, more particularly, it relates to the design and fabrication of transmission lines on multiple layer circuit structures such as printed circuit boards.

2. Discussion of the Prior Art

Printed circuit boards (PCBs) are employed as a foundation for the mounting of various electronic components making up a circuit or system. With the short signal transition times and high clock rates of modem digital circuitry, the electrical properties of the electrical conductors carrying signals between devices become increasingly more important. High-speed logic families such as FAST, ECL and GaAs circuits have required the PCB designer to model the aforementioned electrical signals as transmission lines. Indeed, PCB layout is now deemed very critical to maintaining signal integrity, such as preserving signal edges and reducing distortion due to reflections and crosstalk. Proper impedance control and impedance termination are required in order to achieve desired signal integrity.

Essentially, the impedance of a printed circuit board (PCB) conductor is controlled by its configuration, dimensions (trace width and thickness and height of the board material) and the dielectric constant of the board material. When a signal encounters a change of impedance arising from a change in material or geometry, part of the signal will be reflected and part transmitted. Such reflections are likely to cause aberrations in the signal which may degrade circuit performance (e.g., low gain, noise, and random errors). Each transmission line on a PCB is generally formed by two conductive traces. If one of the two conductors of the transmission line coupling the circuits is used as a grounding connector, the circuit is referenced as single-ended and the transmission line is a single-ended or unbalanced transmission line. Otherwise, the two non-grounded conductors form a differential or balanced transmission line for a differential circuit. Equivalent examples of differential transmission lines are shown in FIG. 1A in which the two conductors $2a$ and $2b$ are implemented as wire rods separated by a dielectric material 4 within a grounded sheath 6—and in FIG. 1B—in which the two conductors are $2a$ and $2b$ are implemented as conductive traces formed by metallizations on dielectric layers $8a$ and $8b$ between ground planes $10a$ and $10b$.

Although all electrical circuits depend on a difference in voltage for their operation, differential signaling refers to where two signals are sent and received with the information conveyed by their different in voltage or current rather than by those individual quantities with respect to a common ground. A differential signal is applied across the two conductors, as voltage varying signals −V and +V applied to conductors $2a$ and $2b$ in FIGS. 1A and 1B, by a differential generating circuit (not shown), the signal travels down the transmission line to a differential receiving circuit (not shown), and the received signal is measured as the difference between the voltage or current in conductors $2a$ and $2b$. In other words, a differential circuit generates or receives a pair of complementary signals in a phase inverted relation with each other, known together as a single differential signal.

The chief advantage of differential signaling is higher noise immunity, achieved by eliminating common-mode influences picked up by the environment. Provided its conductive traces are close enough together to be exposed to nearly the same environmental influences, the differential transmission line is desensitized to voltage drift because the induced noise in each line rise and fall in tandem in the complementary signals and cancel each other. The inherently superior noise immunity of differential circuits allows signal levels to be reduced, with consequent improvements in switching speed, power dissipation and noise. Another advantage lies in the area of ground bounce—since differential pairs always sink and source the same amount of current (into a resistive load), there is no bounce and, in theory, no bounce-induced crosstalk. And since the currents are complementary there is little net magnetic flux from a differential pair, so EMI is dramatically reduced as well.

Despite the aforementioned benefits of configuring PCB traces interconnecting circuit devices as differential transmission lines, complications do arise in the application of this technique to electrical systems in which many signals need to be conveyed wherein it is desired to employ multiple sets of differential lines. An illustrative electrical board 12 embodying the approach is shown in FIG. 2, with three differential transmission lines indicated generally at 14, 16 and 18, being constructed using multiple planes of metallizations over corresponding dielectric layers 20 and 22. Upper ground plane 24 is spaced the same distance above upper conductors $14a$, $16a$ and $18a$ of transmission lines 14, 16 and 18 as lower ground plane 26 is separated from lower conductors $14b$, $16b$ and $18b$, so as to have equal impedances to ground. As between a first differential transmission line as differential conductor pair $14a$ and $14b$ and a second differential transmission line as differential conductor pair $16a$ and $16b$, the problem of crosstalk can arise in which a signal on the first line can induce a voltage on the second line and vice versa.

It is well known that the most effective way to improve local PCB crosstalk between adjacent differential transmission lines is to move the affected traces further away. Assuming one is presented with solid power and ground planes, crosstalk between aggressor and victim traces falls off as the square of increasing distances. Thus, for example, doubling the distance cuts crosstalk to one-fourth. While placing the two traces of a line pair closer together also helps reduce crosstalk, the greatest effect is achieved by generally increasing the separation between aggressor and victim. Unfortunately, however, space is generally limited on printed circuit board structures and design considerations tend to require that the differential transmission lines be placed as closely together as practicable. Accordingly, a need arises for a technique for realizing differential transmission lines as conductive traces on a PCB in which space on the board is used more efficiently than has heretofore been possible without unacceptable degradation in performance due to crosstalk. A further need arises for a PCB which may be fabricated using conventional manufacturing techniques and equipment.

SUMMARY OF THE INVENTION

The aforementioned needs are addressed, and an advance is made in the art, by a multilayer circuit structure which includes first and second superposed planar dielectric layers. On the first layer, first and second conductor lines are formed, and on the second layer, third and fourth conductor lines are formed. The first and third conductor lines, and the second and fourth conductor lines, respectively, form at least a portion of corresponding first and second differential transmission line. The first conductor line extends in parallel with the third conductor line but is both vertically spaced and horizontally offset therefrom such that a first plane orthogonal to and extending through the first and second planar layers extends through one, but not both of the first and third conductor lines (i.e., a non-overlapping region). Similarly, a second plane orthogonal to and extending through the first and second planar layers extends through a non-overlapping region of the second and fourth conductor lines.

The dimensions and electrical properties of the first and third conductor lines are selected so that the characteristic impedance of the first transmission line is matched to the output of a differential transmission circuit which is operable to generate and supply to the first and third conductor lines a pair of complementary current or voltage varying signals in phase inverted relation to one another. Additionally, the characteristic impedance of the first transmission line is matched to the input of a differential receiving circuit configured to measure a difference between the pair of complementary voltage or current varying signals received in phase inverted relation to one another from the differential transmission circuit. Illustratively, the characteristic impedance of the first transmission line may be from about 80 to about 110 ohms.

A method of reducing crosstalk between adjacent differential transmission lines in a multilayer circuit structure comprises the steps of applying a first signal to a first differential transmission line, and applying a second signal to a second differential transmission line adjacent the first differential transmission line, wherein a first electrically conductive element of the first differential transmission line is angularly offset from a second electrically conductive element of the first differential transmission line by a rotation angle selected to result in less crosstalk being induced in the second differential transmission line than would be induced if the first and second electrically conductive elements were aligned in either an over-under orientation in a vertical plane or in a side-by-side orientation in a horizontal plane.

BRIEF DESCRIPTION OF THE DRAWINGS

The various features, benefits and advantages of the present invention may be better understood by reference to the detailed description that follows taken in conjunction with the accompanying drawings, in which.

DETAILED DESCRIPTION OF THE INVENTION

Figure 1B:
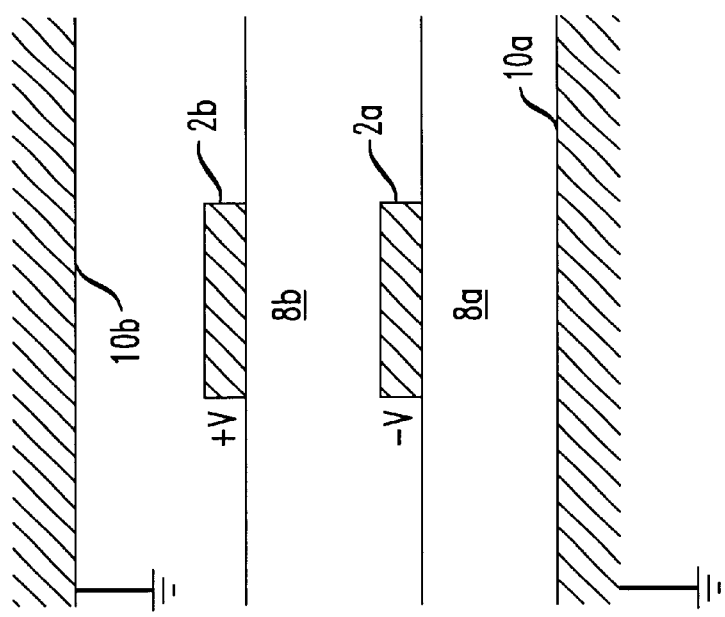
FIG. 1B is a cross-sectional view of a differential transmission line functionally equivalent to the one depicted in FIG. 1B but implemented using strip line conductors as, for example, on dielectric layers of a printed circuit board or integrated circuit package.
Figure 1A:
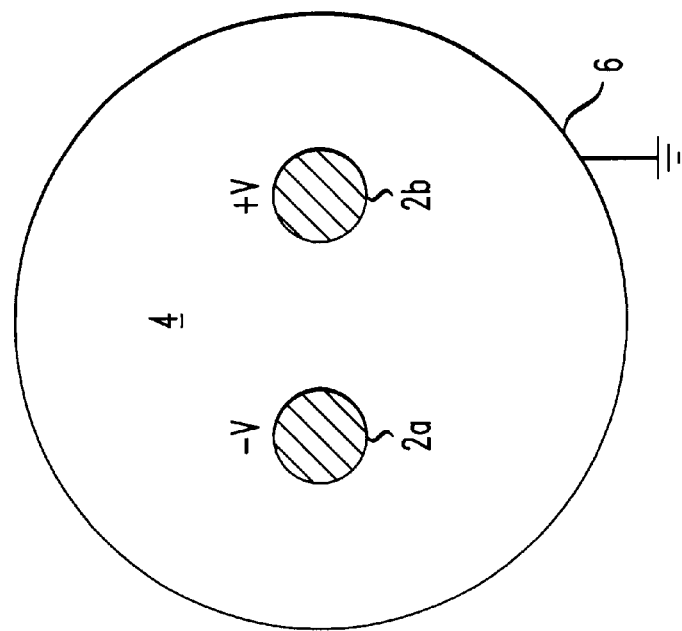
FIG. 1A is a cross-sectional view of a conventional differential transmission line formed by two wire-rod conductors.
Figure 2:
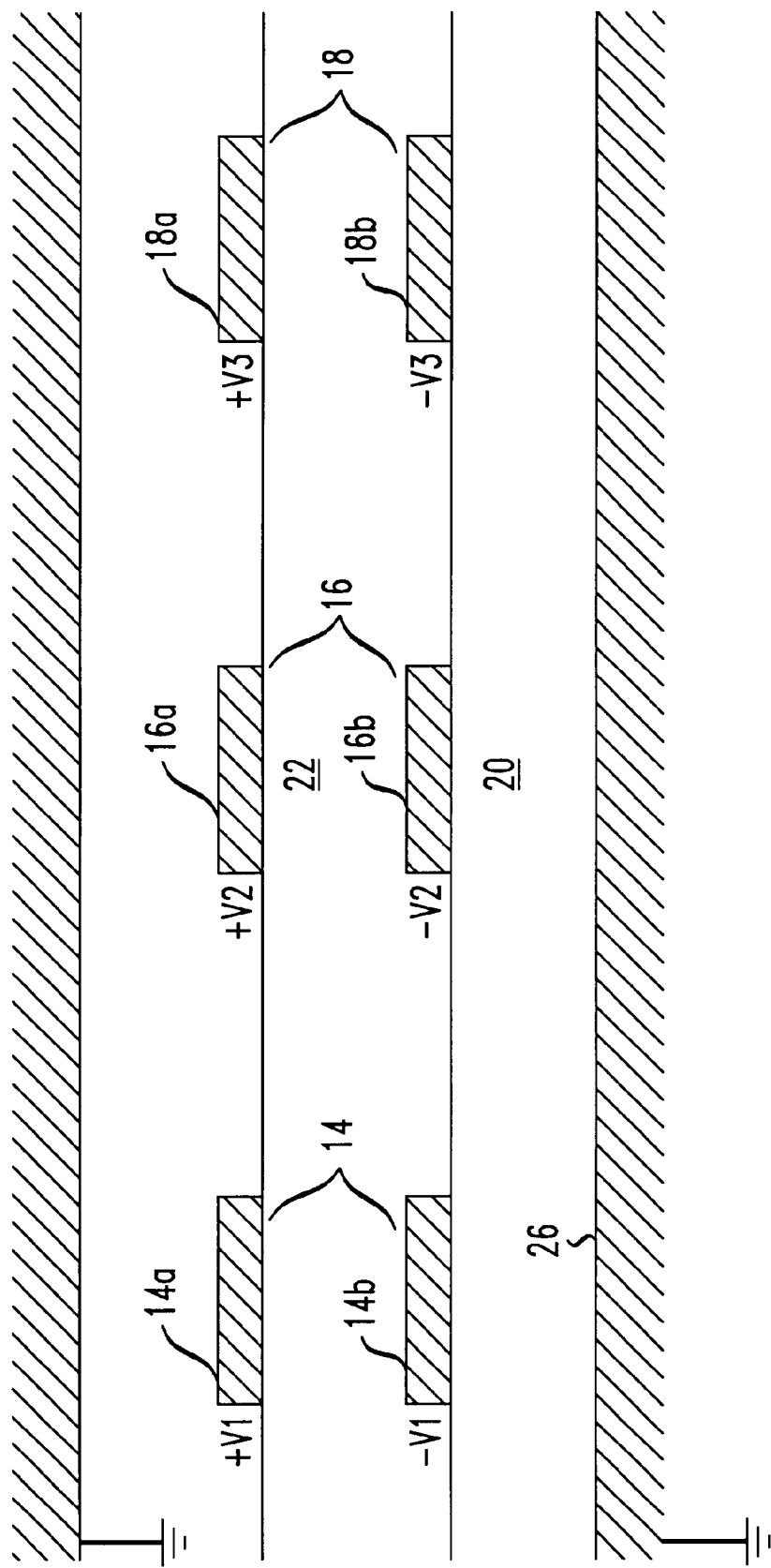
FIG. 2 is a cross-sectional view of a conventional, multiple layer circuit structure having a plurality of differential transmission lines, each carrying a respective differential signal therealong.
Figure 3A:
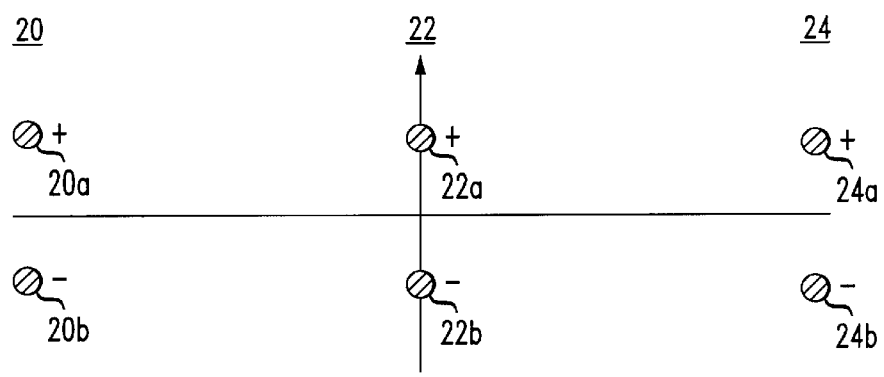
FIGS. 3A and 3B depict respective first and second differential transmission lines in the two orientations which are characteristic of the prior art.
Figure 3B:
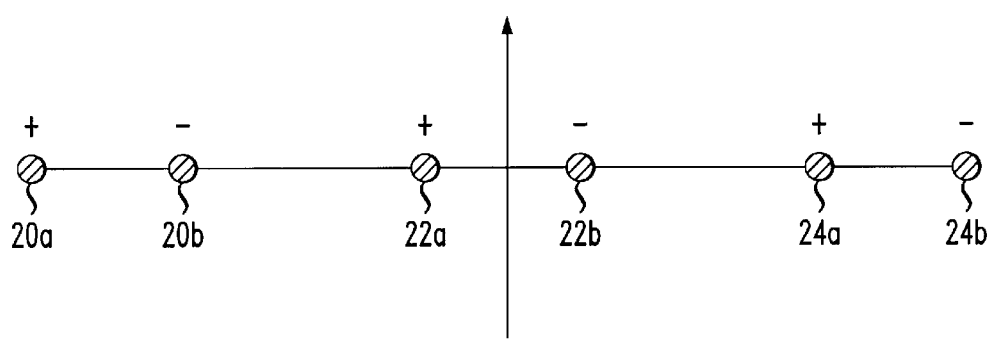

Referring now to the drawings, in which like reference numerals identify similar or identical elements, the principles of the present invention will be initially discussed with respect to a simplified wire-conductor model of a plurality of differential transmission lines each electrically connecting any two devices. In that regard, FIG. 3A depicts a conventional "overunder" arrangement of three conductor pairs, 20a and 20b, 22a and 22b, and 24a and 24b, forming differential transmission lines 20, 22 and 24, respectively. In this arrangement, the vector connecting the center conductors is perpendicular to the vector along which the array of line pairs is disposed. Accordingly, the voltages induced by each conductor of differential line 22 on neighboring lines 20 and 24 (i.e., constituting crosstalk on those lines) are in phase. FIG. 3B, contrastingly, depicts a conventional "side by side" arrangement of the same three conductor pairs forming transmission lines 20, 22 and 24. In this case, the vector connecting conductors 22a and 22b is parallel to the vector along which the array of line pairs is disposed. As such, the crosstalk voltages induced by each conductor of differential line 22 on neighboring lines 20 and 24 are 180 degrees out of phase.

Figure 3C:
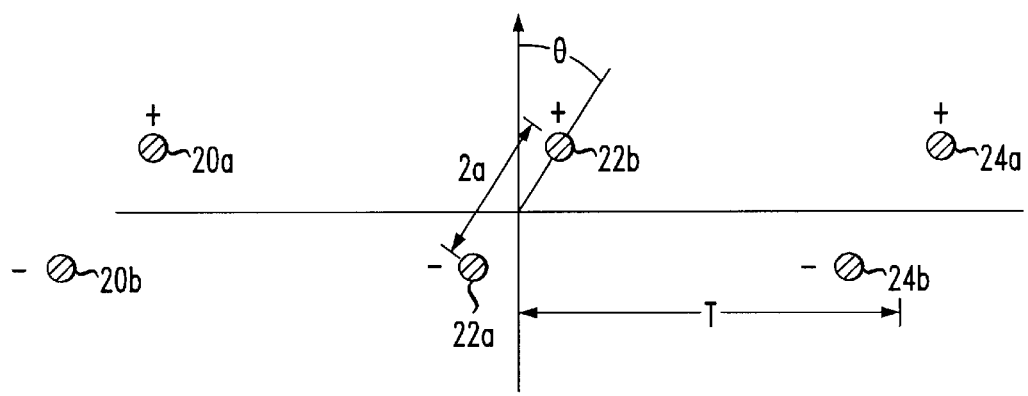
FIG. 3C is a cross sectional view of a multiple differential transmission line structure constructed in accordance with an illustrative embodiment of the present invention, in which the wire-rod conductors of each differential transmission line pair are both vertically spaced and horizontally offset so as to reduce cross talk between adjacent wire-rod pairs.
Figure 4:
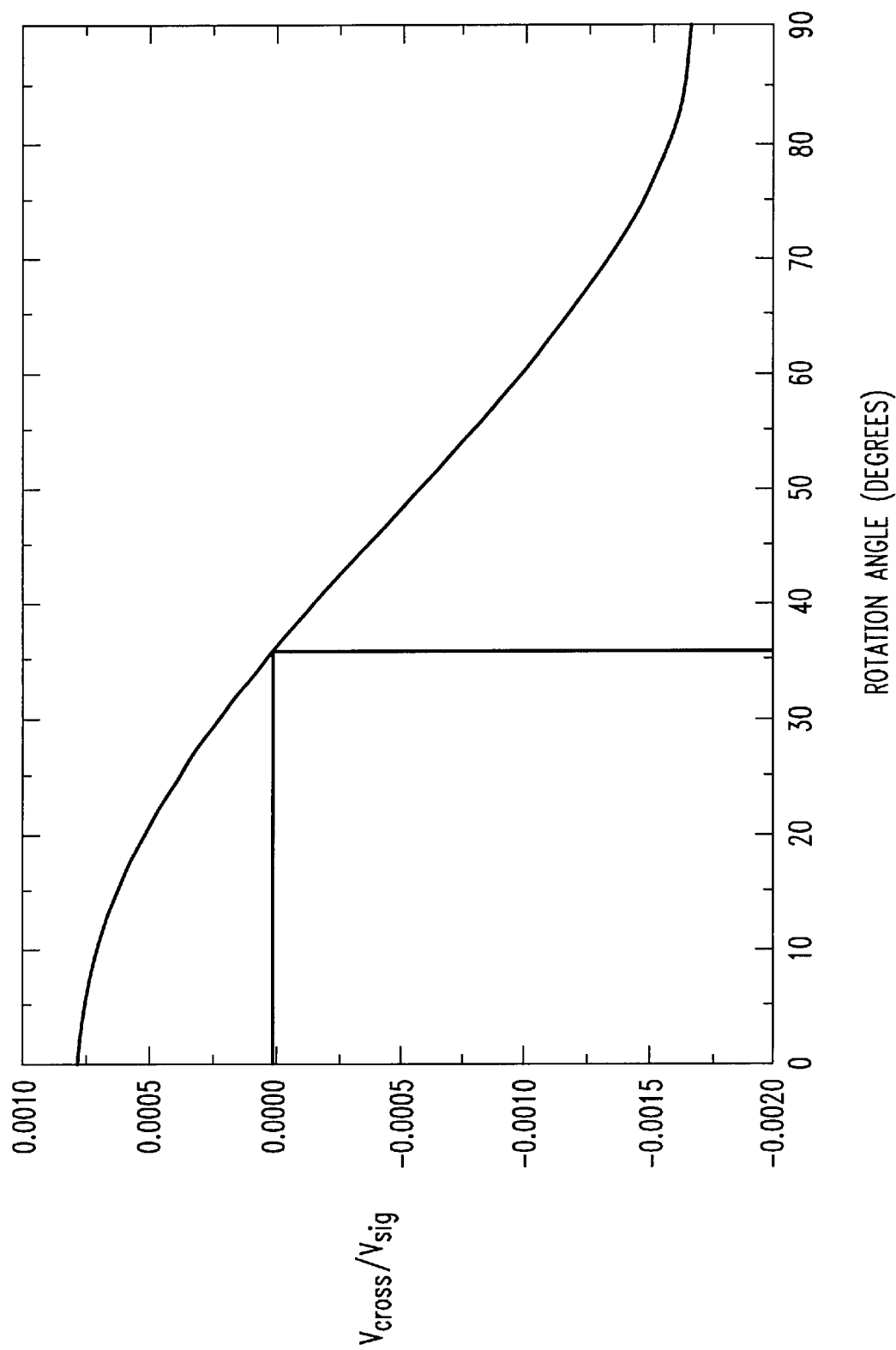
FIG. 4 is a graphical representation depicting differential crosstalk as a function of the respective angular orientation of the wire rod conductors in the illustrative arrangement of FIG. 3C.

As exemplified by FIG. 3C, the inventor herein has recognized that an appropriate angular orientation of conductor pairs relative to adjacent conductor pairs will materially reduce the amount of crosstalk induced in those adjacent pairs as compared to either of the conventional arrangements of FIGS. 3A and 3B. As the conductors of each differential transmission line are rotated, they will eventually come to an angular relationship such, for example, as that shown in FIG. 3C, wherein the induced signal on adjacent lines is approximately zero, and thus no differential signal is produced and, hence, no crosstalk is produced when only differential signals are measured. For the simple thin-rod conductors of FIGS. 3A–3C, the DC (zero frequency) differential signal on a neighboring line is given by:

$$V_{cross}/V_{sig} = (r/T)(2 - 1/((1-2a \sin \theta/T)^2 + (2a \cos \theta/T)^2)^{1/2} - 1((1+2a \sin \theta/T)^2 + (2a \cos \theta/T)^2)^{1/2})$$

where r is the radius of the conductors, $2a$ is the spacing between the conductors in a differential transmission line, $\theta$ is the rotation angle (angular orientation of the conductors relative to a bisecting reference plane) and T is the center to center spacing between adjacent conductor pairs. In FIG. 4, the aforementioned relation is graphically illustrated, as a function of rotation angle for r/T=0.02 and a/T=0.1. For this illustrative case, the differential crosstalk goes through zero at a rotation angle of 36 degrees. Of course, it will be readily appreciated by those skilled in the art that as the parameters of the transmission line are varied, the rotation angle tending to result in the greatest improvement in performance (i.e., lowest induced crosstalk in adjacent transmission lines) will change slightly. Additionally, for signal frequencies other than zero, the rotation angle producing the greatest performance improvement will also differ.

Figure 5:
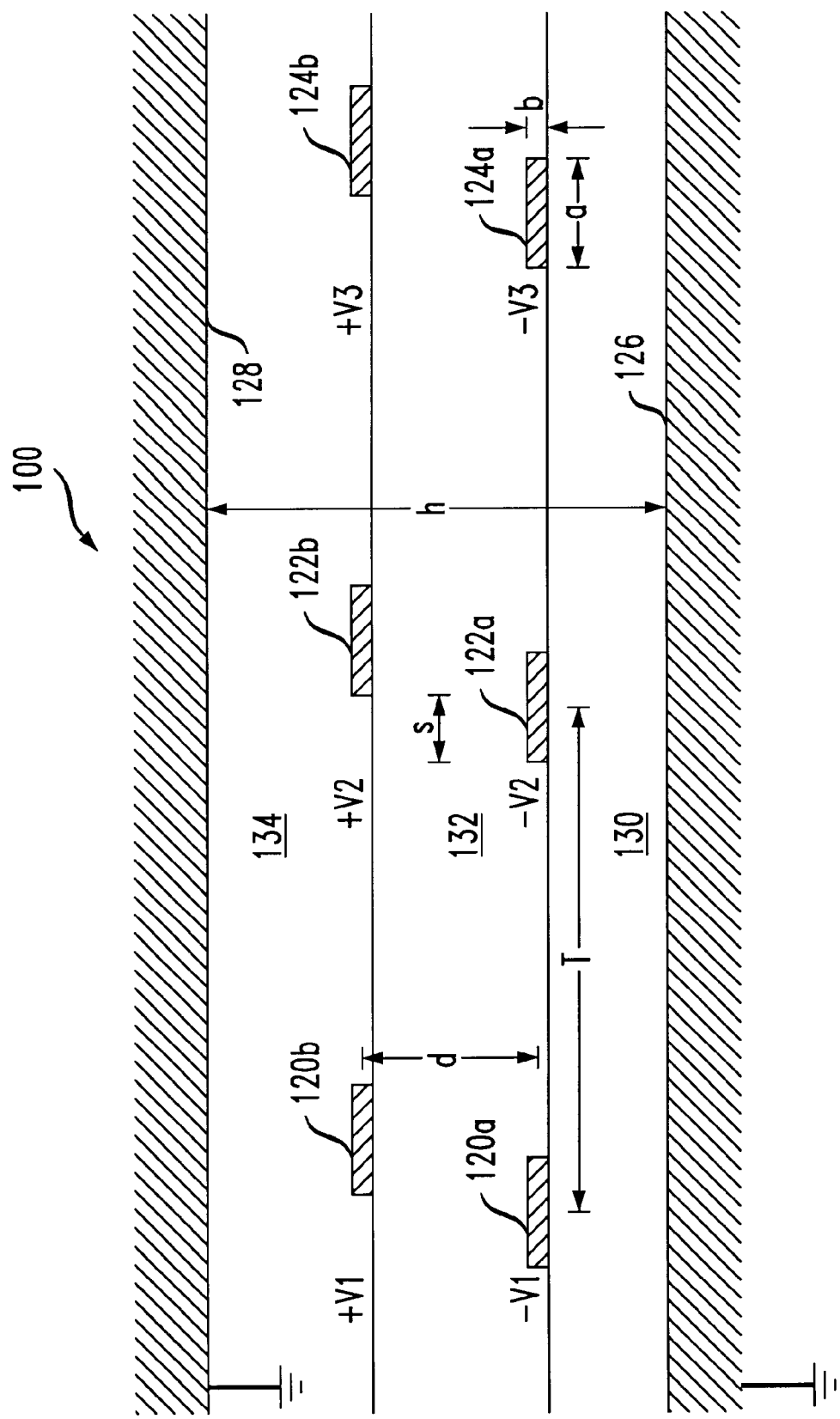
FIG. 5 is a multiple differential transmission line circuit structure constructed in accordance with the present invention, the arrangement of angularly offset wire rods exemplified by FIG. 3C being replaced with an equivalent vertically spaced, horizontally offset arrangement of microstrip line conductors.

A more practical structure embodying the teachings of the present invention is shown in FIG. 5. Essentially, FIG. 5 depicts a multiple layer printed circuit board structure 100 in which the angularly rotated wire rod conductors employed in the simplified model of FIG. 3C are replaced by offset conductive traces indicated generally at 120a, 120b, 122a, 122b, 124a and 124b forming differential transmission lines 120, 122 and 124, respectively. Whether the conductors are thought of as offset or rotated, however, the result is similar.

The illustrative multilayer PCB of FIG. 5 comprises a plurality of planar layers including layers 130, 132, and 134 disposed in superposed laminar relation and made of dielectric material. The lower conductive traces 120a, 122a and 124a are disposed on dielectric layer 130 which isolates them from ground plane 126, these being formed, for example, by a conventional photolithographic process from a plane of metalization defined on a major surface of layer 130. Intermediate layer 132 is disposed on layer 130 and provides a dielectric region between lower conductive traces 120a, 122a, and 124a and the corresponding set of offset upper conductive traces 120b, 122b, and 124b defined, for example, photolithographically on a major surface of layer 132. Dielectric layer 134 isolates conductive traces 120b, 122b, and 124b from a second ground plane 128. To obtain true differential transmission line performance, the dimensions and electrical characteristics of layers 130 and 134 must be as close a match as is possible to obtain using conventional PCB fabrication techniques.

While two layers of conductor paths are shown in the example of FIG. 5, it should be emphasized that any number can be employed without departing from the spirit and scope of the invention. In any event, and with continued reference to FIG. 5, it will be seen that each lower conductive trace as, for example, trace 120a, is essentially parallel to the corresponding upper conductive trace as, for example, trace 120b, in the pair, and typically each is made of copper with a length 1, a width a, and a thickness b. Moreover, and in accordance with the teachings of the present invention, the respective conductive traces are each offset by a dimension, indicated generally at s in FIG. 5. The spacing between upper and lower traces, to the extent there is an overlapping region between them, is given by d, and the center to center spacing between adjacent conductive traces on a given dielectric layer being the dimension T. The respective ground planes are separated by a distance h.

It will thus be understood that a plane orthogonal to and extending through dielectric layers 130, 132 and 134 may extend through a non-overlapping region of conductive traces 122a and 122b. That is, over at least a portion of the width a of the respective conductive traces constituting differential transmission line 122, the aforementioned an imaginary plane may pass through one of the conductive traces 122a and 122b but not both such that they are not directly in an over-under configuration of the type depicted in FIG. 3A. Likewise, a parallel plane extending through one of the conductive traces 124a and 124b will not pass through the other of that pair of conductive traces.

For an illustrative implementation of the inventive arrangement depicted in FIG. 5, in which d is 7 mils, h is 17 mils, T is 19 mils, a is 4 mils, and b is 0.62 mils, reflection-free transmission and reception of differential signals was observed in a differential transmission line electrically interconnecting the output of a differential transmission circuit (not shown) having a characteristic impedance of 100 ohms to a differential receiving circuit (not shown) having a characteristic impedance of 100 ohms, where the respective dielectric layers were comprised of a material having an electrical relative permittivity of 3.4. Differential impedance in ohms, for the exemplary implementation of FIG. 5 described above, is graphically presented as a function of the offset dimension s in FIG. 6.

Figure 6:
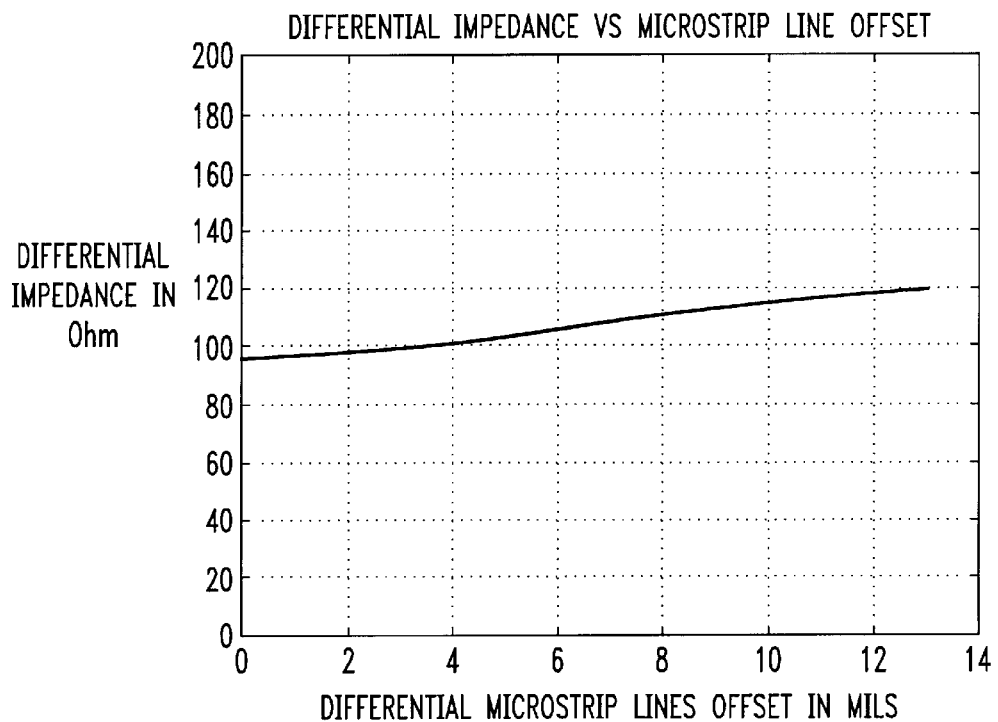
FIG. 6 is a graphical representation showing the value of differential impedance as a function of microstrip offset for the illustrative multiple differential transmission line circuit depicted in FIG. 5.
Figure 7:
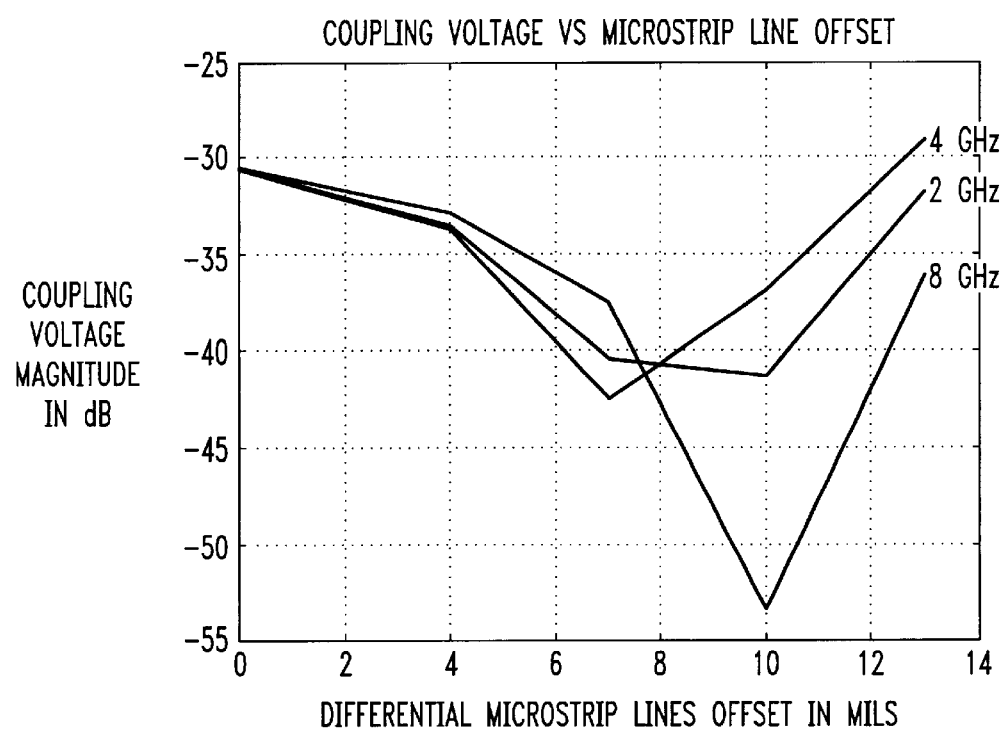
FIG. 7 is a graphical representation showing the level of crosstalk as a function of microstrip offset for the illustrative multiple differential transmission line circuit depicted in FIG. 5.

For the same illustrative example as was considered in connection with FIGS. 5 and 6, the magnitude of coupling voltage (i.e., crosstalk) from a first differential transmission line to an adjacent differential transmission line is graphically represented as a function of conductive trace offset, for three illustrative frequencies, in FIG. 7. For this particular example, an offset of approximately 9 mils appears to produce the best results with respect to minimizing crosstalk. In an equivalent wire-rod simplification, a rotation angle of about 52 degrees would produce the same degree of improvement.

As will be readily appreciated by those skilled in the art, one of the fundamental properties of a transmission line—a mathematical model for a trace on a PCB with power/ground planes—is its characteristic impedance (that is, the ratio of voltage to current of a wave moving down the transmission line). The devices mounted on a PCB themselves possess characteristic impedance, and the impedance of the interconnecting PCB traces must be chosen to match the characteristic impedance of the logic family in use. In order to maximize signal transfer from the source device to the load device, the trace impedance must match both the output impedance of the sending device and the input impedance of the receiving device. For CMOS and TTL, this will be in the region of 80 to 110 ohms. If the impedance of the PCB trace connecting the two devices does not match their output and input impedances, respectively, multiple reflections will occur on the signal line before the load device can settle into a new logic state. The result will typically be increased switching times or random errors in high speed digital systems. The value and tolerance of trace impedance must therefore be carefully specified by the circuit design engineer and the PCB designer.

It is to be understood that the above described embodiments are merely illustrative of the principles of the invention. Various modifications and changes may be made thereto by those skilled in the art which will embody the principles of the invention and fall within the spirit and scope thereof.

What is claimed is:

1. A multilayer printed circuit board, comprising:
   a plurality of planar layers disposed in superposed laminar relation and made of dielectric material, a first of said planar layers having formed thereon first and second conductor lines made of electrically conductive material and a second of said planar layers having formed thereon third and fourth conductor lines made of electrically conductive material;
   said first and third conductor lines forming at least a portion of a first differential transmission line wherein said first conductor line extends in parallel with said third conductor line but is both vertically spaced and horizontally offset therefrom such that a first plane orthogonal to and extending through said first and second planar layers extends through a non-overlapping region of said first and third conductor lines; and said second and fourth conductor lines forming at least a portion of a second differential transmission line wherein said second conductor line extends in parallel with said fourth conductor line but is both vertically spaced and horizontally offset therefrom such that a second plane orthogonal to and extending through said first and second planar layers extends through a non-overlapping region of said second and fourth conductor lines but does not extend through either one of said first and third conductor lines, whereby crosstalk induced in the second differential transmission line by a differential signal traversing the first differential transmission line is lower than crosstalk which would otherwise be induced therein if said first, second, third and fourth conductor lines were disposed in a single plane.

2. The multilayer printed circuit board of claim 1, further including a differential generating circuit electrically coupled to said first and third conductor lines for generating and supplying thereto a pair of complementary current or voltage varying signals in phase inverted relation to one another.

3. The multilayer printed circuit board of claim 1, further including a differential receiving circuit electrically coupled to said first and third conductor lines for measuring a difference between a pair of complementary voltage or current varying signals received in phase inverted relation to one another over said first differential transmission line.

4. The multilayer printed circuit board of claim 1, wherein said first planar layer is disposed above said second planar layer and wherein said third conductor line is slightly longer than said third conductor line, at least one conductive interconnect being formed, between said third conductor line and a reference potential, at a location near where a voltage or current varying signal is supplied to said third conductor line to thereby compensate for a delay between a signal on said third conductor line and a signal on said first conductor line.

5. The multilayer printed circuit board of claim 1, wherein at least one of said first and second differential transmission lines has a characteristic impedance of between from about 80 to about 110 ohms.

6. The multilayer printed circuit board of claim 1, wherein each said conductor line is formed from an etched copper metallization layer.

7. A multilayer circuit structure, comprising:
a first pair of parallel elongated electrically conductive elements separated from each other and a ground plane by a dielectric and constituting a first differential transmission line; and a second pair of parallel elongated electrically conductive elements separated from each other and a ground plane by a dielectric and constituting a second differential transmission line, wherein a first electrically conductive element of the first differential transmission line is angularly offset from a second electrically conductive element of the first differential transmission line by a rotation angle selected to result in less crosstalk being induced in said second differential transmission line than would be induced if said first and second electrically conductive elements were aligned in either a vertical or horizontal plane.

8. The multilayer circuit structure of claim 7, wherein a first electrically conductive element of the second differential transmission line is angularly offset from a second electrically conductive element of the second differential transmission line by the same rotation angle as the conductive elements of the first differential transmission line.

9. The multilayer circuit structure of claim 7, further including a differential generating circuit electrically coupled to and matching a characteristic impedance of said first transmission line, said differential generating circuit being operable to generate and supply thereto a pair of complementary current or voltage varying signals in phase inverted relation to one another.

10. The multilayer circuit structure of claim 7, further including a differential receiving circuit electrically coupled to and matching a characteristic impedance of said first transmission line, said differential receiving circuit being operable to measure a difference between a pair of complementary voltage or current varying signals received in phase inverted relation to one another over said first differential transmission line.

11. The multilayer circuit structure of claim 7, wherein at least one of said first and second differential transmission lines has a characteristic impedance of between from about 80 to about 110 ohms.

12. The multilayer circuit structure of claim 7, wherein a first conductive element of each pair is a conductive trace formed on a major surface of a first dielectric layer of a printed circuit board, and wherein a second conductive element of each pair is a conductive trace formed on a major surface of a second dielectric layer of a printed circuit board.

13. The multilayer circuit structure of claim 7, wherein each said conductive element is a wire rod conductor.

14. The multilayer circuit structure of claim 13, wherein each said conductive element of a pair is angularly offset from the other conductive element of a pair by a rotation angle of between from about 10 degrees to about 80 degrees relative to a vertical plane passing through a midpoint between said conductive elements.

15. A method of reducing crosstalk between adjacent differential transmission lines in a multilayer circuit structure comprising the steps of:
applying a first signal to a first differential transmission line; and applying a second signal to a second differential transmission line adjacent the first differential transmission line, wherein a first electrically conductive element of the first differential transmission line is angularly offset from a second electrically conductive element of the first differential transmission line by a rotation angle selected to result in less crosstalk being induced in said second differential transmission line than would be induced if said first and second electrically conductive elements were aligned in either an over-under orientation in a vertical plane or in a side-by-side orientation in a horizontal plane.

* * * * *